United States Patent
Chen et al.

(10) Patent No.: US 7,046,493 B2
(45) Date of Patent: May 16, 2006

(54) INPUT/OUTPUT BUFFER PROTECTION CIRCUIT

(75) Inventors: Sheng-Hua Chen, Kaohsiung (TW); Hung-Yi Chang, Hsinchu (TW); Jeng-Huang Wu, Taipei (TW)

(73) Assignee: Faraday Technology Corp., Hsin-Chu (TW)

( * ) Notice: Subject to any disclaimer, the term of this patent is extended or adjusted under 35 U.S.C. 154(b) by 341 days.

(21) Appl. No.: 10/735,324

(22) Filed: Dec. 12, 2003

(65) Prior Publication Data

US 2005/0128670 A1 Jun. 16, 2005

(51) Int. Cl.
*H02H 9/00* (2006.01)

(52) U.S. Cl. ...................... 361/56; 361/91.1; 361/93.1; 361/111

(58) Field of Classification Search .............. 361/91, 361/56, 111, 93.1, 93.5, 91.1

See application file for complete search history.

(56) References Cited

U.S. PATENT DOCUMENTS 6,084,431 A * 7/2000 Shigehara et al. ............ 326/81

* cited by examiner

*Primary Examiner*—Karl Easthom
*Assistant Examiner*—Robert T. Dang
(74) *Attorney, Agent, or Firm*—Winston Hsu

(57) ABSTRACT

An input/output buffer protection circuit, which comprises an I/O pad, an I/O buffer, an n-well control circuit, a gate control circuit, and a protection component. The I/O buffer includes a PMOS transistor and a NMOS transistor. The n-well control circuit is coupled to an n-well of the PMOS transistor. When an input voltage higher than a source voltage is applied, voltage at the n-well of the PMOS is increased by the n-well control circuit to the input voltage level. The gate control circuit is coupled to the gate terminal of the PMOS transistor and the input/output pad. When an input voltage higher than a source voltage is applied, voltage at the gate terminal of the PMOS is increased by the gate control circuit to the source voltage level. Wherein the gate control circuit comprises a transistor and the transistor transfers a high potential control voltage to the gate of the PMOS transistor in output mode. The protection component is coupled between the gate of the transistor and the I/O pad to generate a voltage drop down path and block the I/O pad signal from flowing back to the gate of the transistor.

7 Claims, 5 Drawing Sheets

INPUT/OUTPUT BUFFER PROTECTION CIRCUIT

BACKGROUND OF THE INVENTION

1. Field of the Invention

The present invention relates to an input/output buffer, and more particularly, the invention relates to an input/output buffer protection circuit.

2. Description of the Related Art

Conventionally, most IC devices are driven by a system voltage in the range of 0–5 V (volt). In these IC devices, the high-voltage logic signal is therefore set at the system voltage and the low-voltage logic signal is set at the ground voltage. With advances in semiconductor technology, however, the system voltage can be now reduced to 3.3 V because the gate oxide layers in the IC device can be made thinner. Still lower system voltage may be possible in the future. In practice, however, a new 3.3 V IC device is typically used in conjunction with older 5 V peripheral devices. For example, a new 3.3 V VGA (video graphic adapter) IC may be used in conjunction with older 5 V peripheral devices in a personal computer, resulting in incompatibilities therebetween.

FIG. 1 is a schematic circuit diagram showing the circuit structure of a conventional I/O buffer used in a 3.3 V source voltage $V_{cc}$. As shown, the I/O buffer 10 is coupled to an input buffer 11 and an I/O pad 20 of an IC device. The I/O buffer 10 is composed of a PMOS transistor P1, and an NMOS transistor N1. When the I/O buffer operates in input mode, both the PMOS transistor P1 and the NMOS transistor N1 must be switched off. subjecting the PMOS transistor a high-voltage signal from the gate of PMOS transistor P1, for example 3.3 V, and the NMOS transistor to be subjected to the gate of the NMOS N1 Low-voltage signal, thereby switching the PMOS P1 and NMOS n1 into a non-conducting state.

If, however, the I/O pad 20 receives a 5 V input logic signal, the PMOS transistor P1 is subjected to a gate voltage of 3.3 V, a drain voltage of 5 V, and a source voltage of 3.3 V. Since the drain of the PMOS transistor P1 is connected to the I/O pad 20, which is now receiving the 5 V input logic signal which is higher than the 3.3 V system voltage, and the substrate thereof is connected to the 3.3 V system voltage, the PN junction diode will be subjected to a forward bias, thus causing an undesired leakage current to flow between the external 5 V source and the internal 3.3 V source.

As a solution to the aforementioned problem, an improved I/O buffer for the 3.3V IC has been proposed. FIG. 2 is a schematic diagram showing the improved I/O buffer. The I/O buffer further comprises an n-well circuit 3 and a gate control circuit 4, wherein the n-well circuit 3 includes a PMOS $P_2$, PMOS $P_3$, PMOS $P_4$ and NMOS $N_4$, the gate control circuit 4 includes a PMOS $P_5$, a PMOS $P_6$ and a NMOS $N_2$. When the I/O buffer operates in input mode with a 5V input logic signal, the PMOS $P_2$ and PMOS $P_3$ of the n-well circuit 3 are turned on, thereby raising the potential of the n-well of PMOS $P_1$ to 5V through PMOS $P_2$. concurrently, the PMOS $P_4$ is turned off and the PMOS $P_5$ is turned on, raising the potential at the output of the gate control circuit 4 to 5V and is transfered to the gate of the PMOS $P_1$.

When, however, a 5V signal is applied to the I/O pad 20, it causes the gate of the PMOS transistor $P_6$ to receive the I/O signal through PMOS $P_3$ and the potential is raised to 5V. When the voltage at the I/O pad 20 pulled down from high voltage (5V) to low voltage (0V), the PMOS $P_3$ is switched off at about 3.3V, while the voltage at the gate terminal of the PMOS is still 3.3V. Thus, performance of the PMOS $P_6$ may suffer.

SUMMARY OF THE INVENTION

Accordingly, an object of the present invention is to provide an input/output buffer protection circuit, to improve output performance.

In order to achieve the above object, the invention provides an input/output buffer protection circuit, which comprises an I/O pad, an I/O buffer, an n-well control circuit, a gate control circuit, and a protection component. The I/O buffer includes a PMOS transistor and a NMOS transistor. The n-well control circuit is coupled to an n-well of the PMOS transistor. When an input voltage higher than a source voltage is applied, voltage at the n-well of the PMOS is increased by the n-well control circuit to the input voltage level. The gate control circuit is coupled to the gate terminal of the PMOS transistor and the input/output pad. When an input voltage higher than a source voltage is applied, voltage at the gate terminal of the PMOS is increased by the gate control circuit to the source voltage level. The gate control circuit comprises a transistor and the transistor transfers a high potential control voltage to the gate of the PMOS transistor in output mode. The protection component is coupled between the gate of the transistor and the I/O pad to generate a voltage drop down path and block the I/O pad signal from flowing back to the gate of the transistor.

A detailed description is given in the following with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 3:
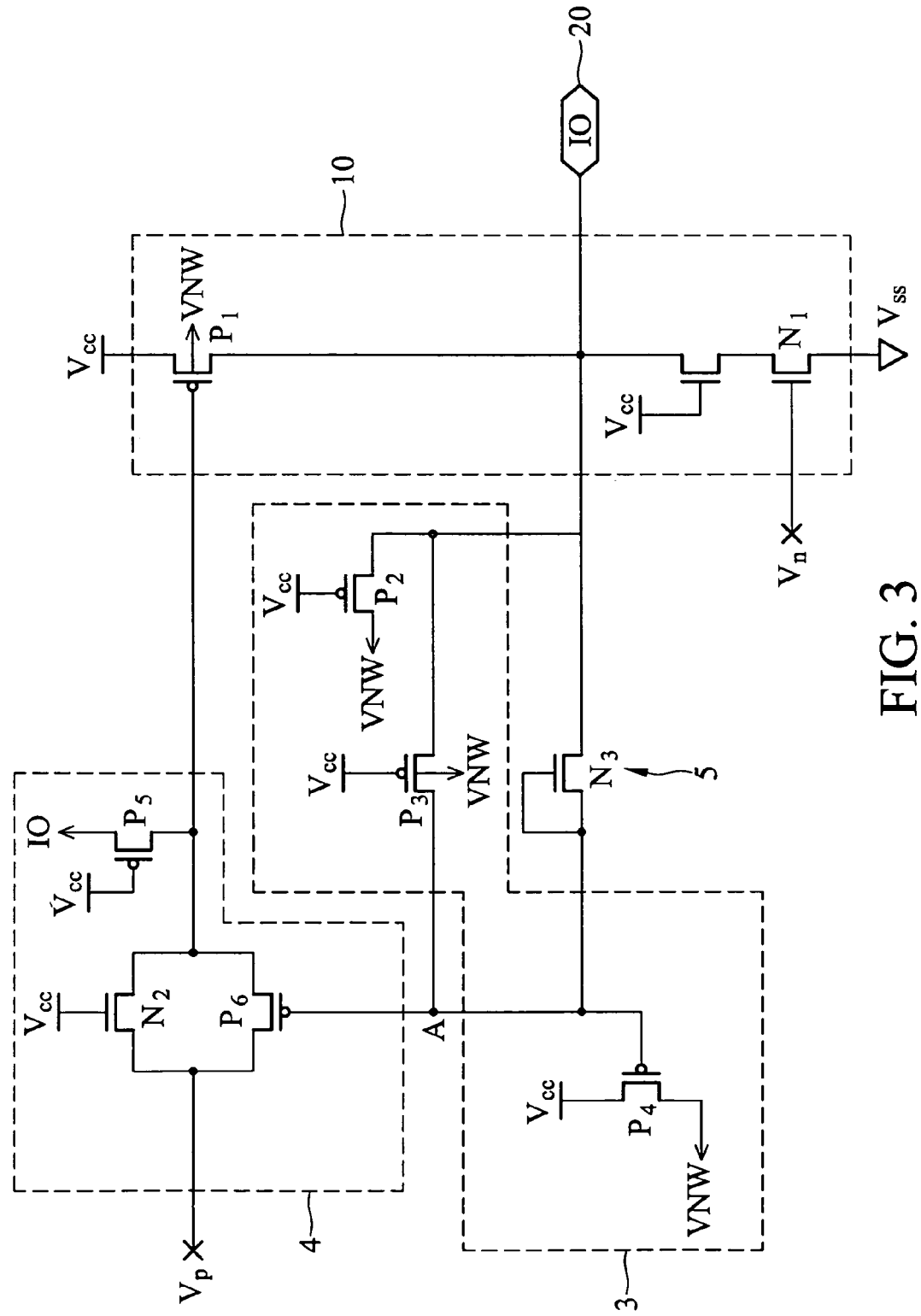
FIG. 3 is an I/O buffer protection circuit in accordance with the present invention.

FIG. 3 is a schematic circuit diagram according to a preferred embodiment of this invention. The main difference between the I/O protective circuit and the conventional circuit of FIG. 3 is that a protection component 5 is set.

The I/O buffer protective circuit includes an I/O pad 20, an I/O buffer 10, an n-well control circuit 3, a gate control circuit 4, and a protection component 5.

The I/O buffer comprises a PMOS transistor $P_1$ (first PMOS) and a NMOS transistor $N_1$ (first NMOS);

The n-well control circuit 3 includes a PMOS $P_2$(second PMOS), a PMOS $P_3$ (third PMOS), and a PMOS $P_4$ (fourth PMOS). The gate terminal of the PMOS $P_2$ is connected to a source voltage $V_{cc}$ (according to this embodiment $V_{cc}$=3.3 V), a source terminal of the PMOS $P_2$ is connected to the I/O pad 20, and the drain terminal of the PMOS $P_2$ is connected to the n-well of the PMOS $P_3$ and the n-well of the PMOS $P_1$. The gate terminal of the PMOS $P_3$ is connected to a source voltage $V_{cc}$, a drain terminal of the PMOS $P_3$ is connected to a node A, a source terminal of the PMOS $P_3$ is coupled to the I/O pad 20, an n-well of the PMOS $P_3$ is connected to the drain terminal of the PMOS $P_2$. The gate terminal of the PMOS $P_4$ is connected to the node A, a source terminal is connected to the source voltage $V_{cc}$, and the drain terminal of the PMOS $P_4$ is connected to the n-well of the PMOS $P_3$.

The gate control circuit 4 includes a PMOS $P_5$ (fifth PMOS), a PMOS $P_6$ (sixth PMOS), a NMOS $N_2$ (second NMOS), and a protection component 5. The gate terminal of the PMOS $P_5$ is connected to the source voltage $V_{cc}$, the source terminal is connected to the I/O pad 20. The gate terminal of the PMOS $P_6$ is connected to the drain of the PMOS $P_3$, and a source terminal of the PMOS $P_6$ is connected to a control signal $V_P$, a drain terminal coupled to the gate of the PMOS $P_1$. A gate terminal of the NMOS $N_2$ is connected to the source voltage $V_{cc}$, a drain terminal of the NMOS transistor $N_2$ is connected to the control signal $V_P$, a source terminal of the NMOS $N_2$ is connected to the gate of the PMOS $P_1$.

The protection component 5 is a diode, or other transistors in a diode configuration, here embodied by NMOS $N_3$. The gate terminal and the source terminal are coupled to the node A which is connected to the gate of the PMOS transistor $P_6$, the drain terminal of the NMOS transistor $N_3$ is connected to the I/O pad 20.

When in input mode, if the input signal is 5V which is higher than the source voltage $V_{cc}$, inside the N-well control circuit 3, the PMOS $P_2$ and the PMOS $P_3$ is turned on, therefore, 5V is applied to the n-well of the PMOS $P_1$ through PMOS $P_2$. Inside the gate control circuit 4, the PMOS $P_5$ is turned on, so 5V is applied to the gate of the PMOS $P_1$ through the PMOS $P_5$. Additionally, the gate of the PMOS $P_6$ is raised to 5V, and the PMOS $P_6$ is switched off.

When the I/O pad 20 voltage drops from high voltage (ex:5V) to low voltage (ex:0V) in input mode, because the PMOS $P_3$ is switched off at about 3.3V, a forward bias path is formed between node A and the I/O pad 20, so the voltage signal at the gate terminal of the PMOS $P_6$ will pass through the NMOS $N_3$ to the I/O pad 20, the potential at the gate of the PMOS $P_6$ (0.7V) increases slightly to be higher than the potential at the I/O pad 20 (0 V).

When the I/O buffer transitions from input mode to output mode, if high potential control signals $V_p$ and Vn are applied (according to this embodiment $V_p$=Vn=3.3 V), the output voltage of the I/O pad 20 is reduced due to the turn-on of NMOS $N_1$. The NMOS $N_3$ provides a leakage path to pull down the voltage at the gate of PMOS P6, and the PMOS $P_6$ is turned on to fully pass Vp to the gate of PMOS $P_1$, completely turning off PMOS $P_6$.

Figure 1:
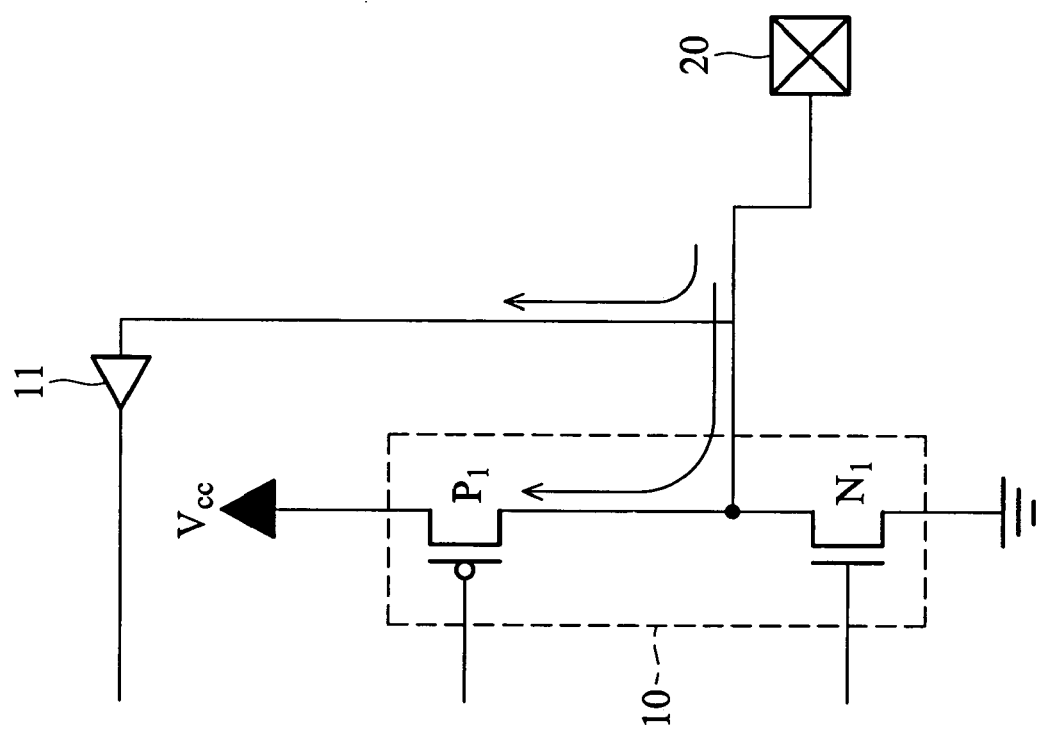
FIG. 1 is a schematic circuit diagram showing the circuit structure of a conventional I/O buffer used in a 3.3 V source voltage $V_{cc}$.
Figure 2:
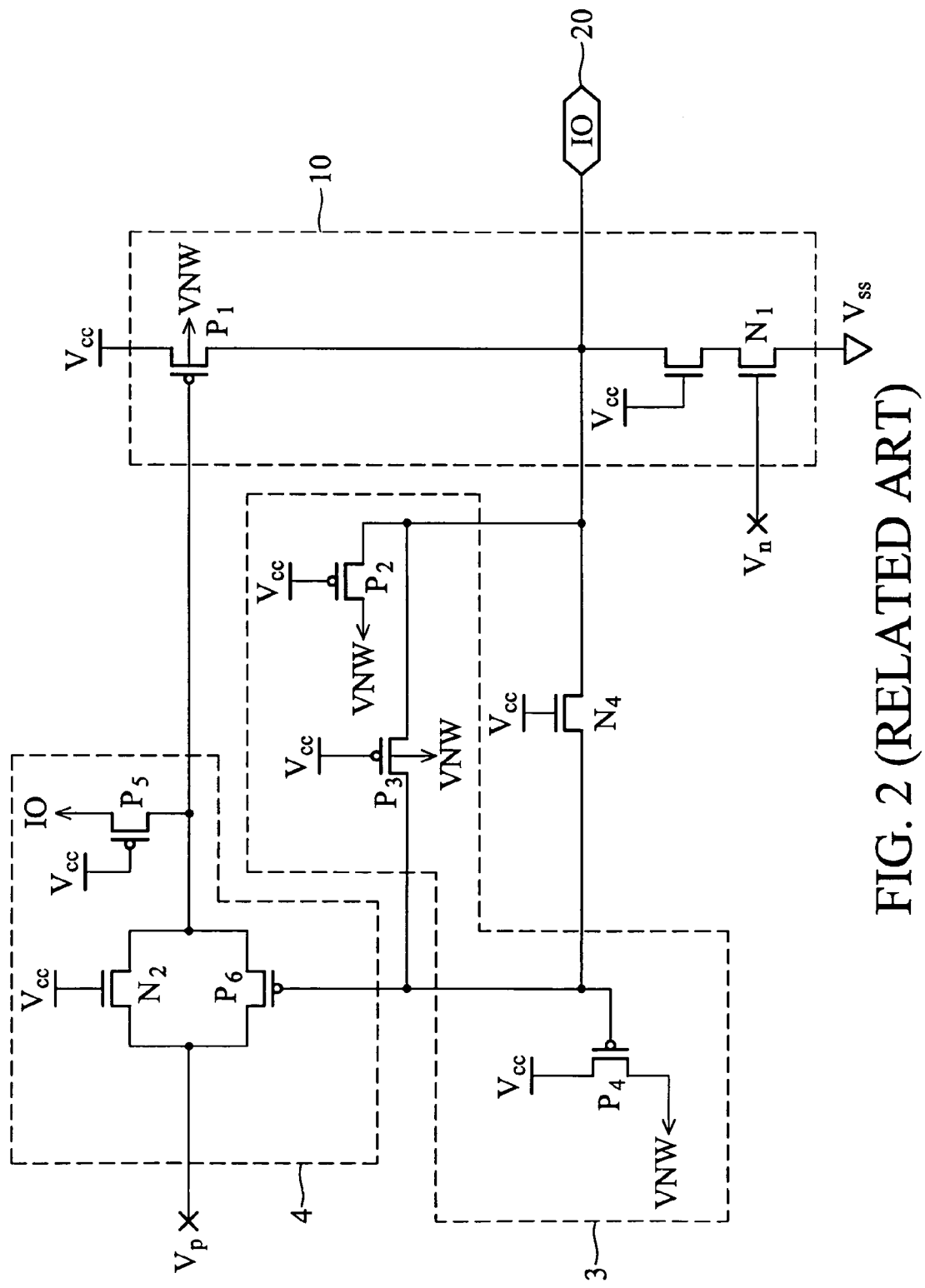
FIG. 2 is a conventional schematic diagram showing an improved I/O buffer.

The present invention offers enhanced output performance in comparision with the related art as referenced in FIG. 2, in which the Vp can not be fully passed and PMOS $P_6$ can not be completely turned off.

Figure 4:
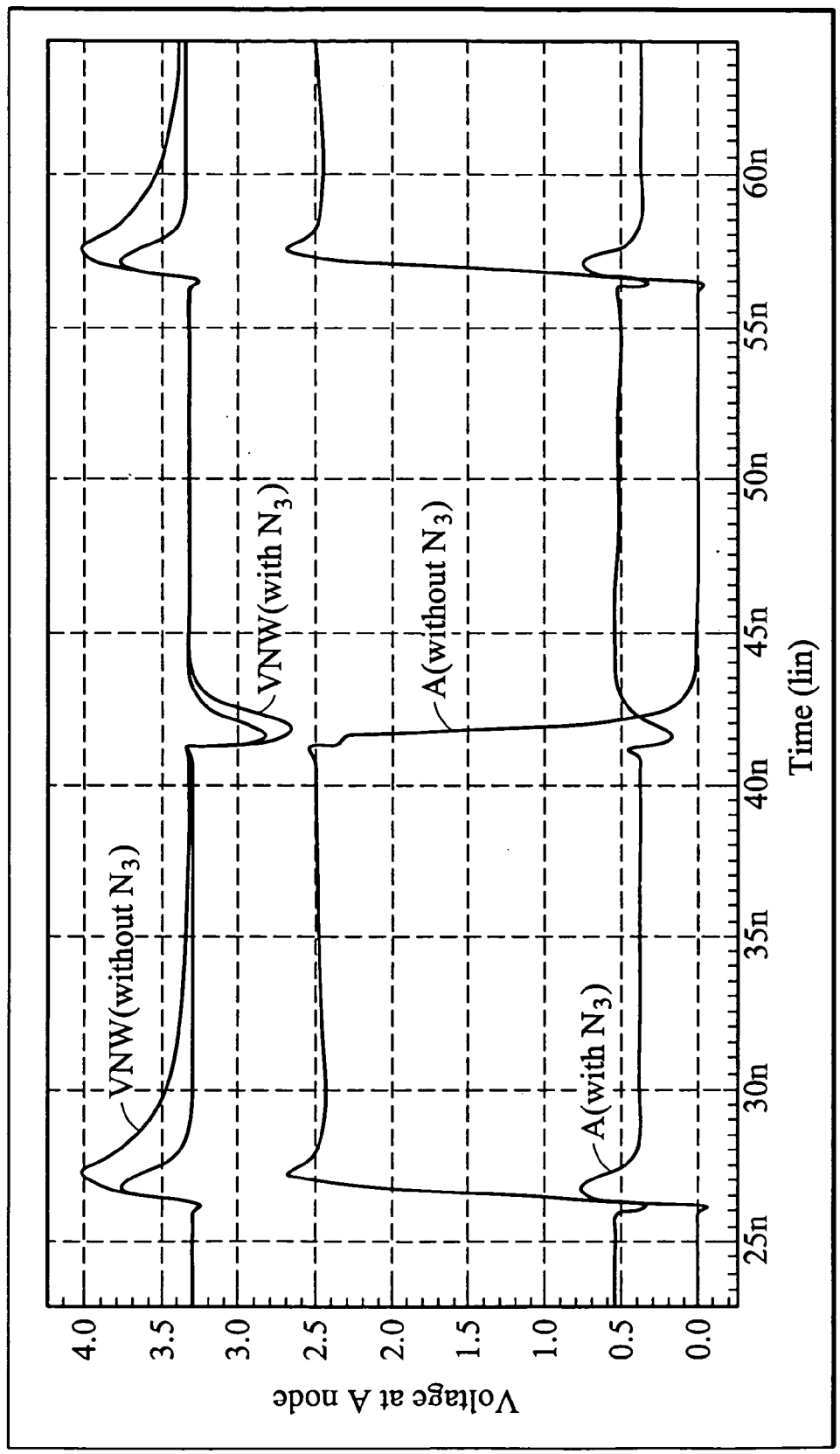
FIG. 4 is waveform comparison graph showing the signal output at the PMOS N-well and the A node.
Figure 5:
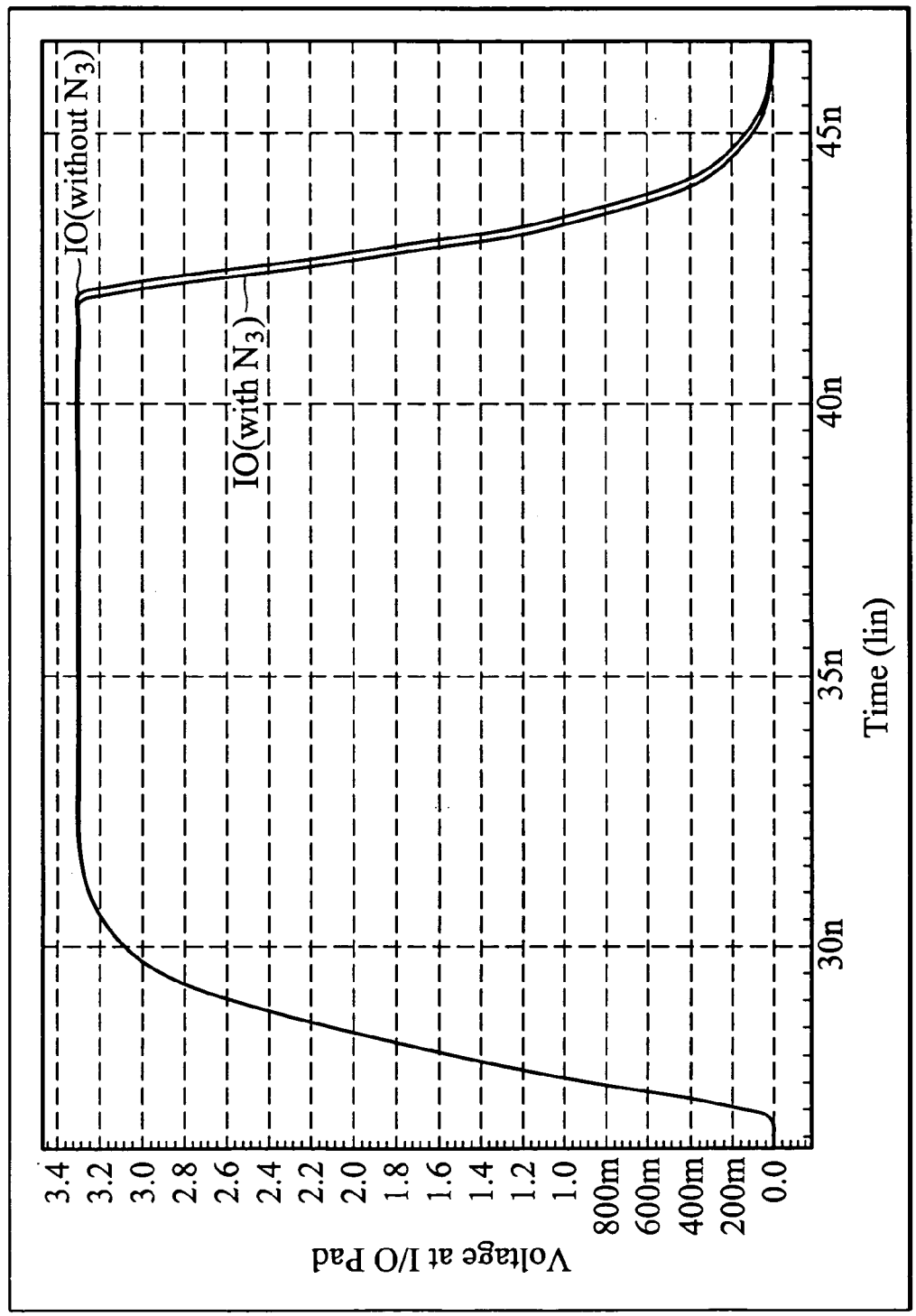
FIG. 5 is waveform comparison graph showing the signal at the I/O pad.

FIGS. 4 and 5 are waveform comparison graphs showing the signal output at the N-well of PMOS $P_1$, the A node, and the I/O pad between with the NMOS transistor $N_3$, formed without the NMOS transistor $N_3$. From the comparison graphs, the voltage at the A node with NMOS transistor $N_3$ is more stable than the voltage without the NMOS transistor, and the output signal performance at the I/O pad is better with the protection component when the signal drops from high potential to low potential.

While the invention has been described by way of example and in terms of the preferred embodiment, it is to be understood that the invention is not limited to the disclosed embodiments and the protection component is mot limited to the NMOS transistor. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A input/output buffer protection circuit, comprising:
   an I/O pad;
   an I/O buffer, comprising a first PMOS transistor and a first NMOS transistor;
   an n-well control circuit coupled to an n-well of the first PMOS transistor and the I/O pad for raising the n-well of the first PMOS transistor to a input voltage level when the input voltage is greater than a source voltage;
   a gate control circuit coupled to a gate terminal of the first PMOS transistor and the n-well control circuit for raising the gate terminal of the PMOS transistor to the input voltage level when the input voltage is greater than the source voltage, the gate control circuit comprises a transistor for passing a control voltage to the gate of the PMOS transistor in output mode; and
   wherein the n-well control circuit comprising a protection component, providing a voltage drop down path from the gate of the transistor to the I/O pad and block the I/O pad signal flow back to the gate of the transistor.

2. The input/output buffer protection circuit of claim 1, wherein the N-Well control circuit comprising:
   a second PMOS transistor, wherein the gate terminal of the second PMOS is connected to a source voltage $V_{cc}$, a source terminal of the second PMOS is connected to the I/O pad, and the drain terminal of the second PMOS is connected to the n-well of the PMOS transistor of the I/O buffer; and
   a third PMOS transistor, wherein the gate terminal of the third PMOS is connected to a source voltage, a source terminal of the third PMOS is coupled to the I/O pad, a n-well of the third PMOS is connected to the drain terminal of the second PMOS; and
   a fourth PMOS transistor, wherein the gate terminal of the fourth PMOS transistor is connected to the drain of the third PMOS, a source terminal is connected to the source voltage, and the drain terminal of the fourth PMOS is connected to the n-well of the third PMOS.

3. The input/output buffer protection circuit of claim 2, wherein the transistor of the gate control circuit is a sixth PMOS transistor, the gate control circuit further comprising:
   a fifth PMOS transistor;
   wherein the gate terminal of the fifth PMOS is connected to the source voltage, the source terminal is connected to the I/O pad;
   a sixth PMOS transistor, wherein the gate terminal is connected to the drain of the third PMOS, a source terminal is connected to the control signal, and a drain terminal coupled to the gate of the first PMOS; and
   a second NMOS transistor, wherein a gate terminal of the NMOS is connected to the source voltage, a drain terminal is connected to the control signal, and a source terminal is connected to the gate of the first PMOS.

4. The input/output buffer protection circuit of claim 1 or claim 3, wherein the protection component is an NMOS transistor.

5. The input/output buffer protection circuit of claim 4, wherein a gate terminal and a source terminal are coupled to a node A which is connected to the gate of the sixth PMOS transistor, a drain terminal of the NMOS transistor is connected to the I/O pad.

6. The input/output buffer protection circuit of claim 1, wherein the protection component is a PMOS transistor.

7. The input/output buffer protection circuit of claim 1, wherein the protection component is a diode configured device.

* * * * *